(12) United States Patent
Kim et al.

(10) Patent No.: US 7,426,143 B2
(45) Date of Patent: Sep. 16, 2008

(54) SEMICONDUCTOR MEMORY DEVICE AND RELATED PROGRAMMING METHOD

(75) Inventors: Bo-Geun Kim, Hwaseong-si (KR); Heung-Soo Lim, Yongin-si (KR); Jae-Woo Im, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 11/407,969

(22) Filed: Apr. 21, 2006

(65) Prior Publication Data

US 2007/0025158 A1 Feb. 1, 2007

(30) Foreign Application Priority Data

Jul. 27, 2005 (KR) .................... 10-2005-0068561

(51) Int. Cl.
*G11C 11/34* (2006.01)
*G11C 16/06* (2006.01)

(52) U.S. Cl. ................. 365/185.22; 365/185.21; 365/185.05

(58) Field of Classification Search ............ 365/185.22, 365/185.21, 185.05
See application file for complete search history.

(56) References Cited

U.S. PATENT DOCUMENTS

| 6,813,207 | B2 | 11/2004 | Honda |
| 6,836,431 | B2 | 12/2004 | Chang |
| 2003/0048689 | A1 | 3/2003 | Kim |
| 2004/0062111 | A1* | 4/2004 | Tanzawa et al. ............. 365/202 |
| 2004/0228177 | A1* | 11/2004 | Kouno .................... 365/185.12 |
| 2005/0213388 | A1* | 9/2005 | Yamada ................. 365/185.22 |

FOREIGN PATENT DOCUMENTS

| JP | 2000-048582 | 2/2000 |
| JP | 2003-022683 | 1/2003 |
| JP | 2003-272390 | 9/2003 |
| KR | 2003-0061345 | 7/2003 |
| KR | 1020030002730 | 9/2003 |

\* cited by examiner

*Primary Examiner*—Richard T. Elms
*Assistant Examiner*—Toan Le
(74) *Attorney, Agent, or Firm*—Volentine & Whitt, PLLC

(57) ABSTRACT

A NOR flash memory device and related programming method are disclosed. The programming method includes programming data in a memory cell and, during a program verification operation, controlling the supply of current from a sense amplifier to the memory cell in relation to the value of the programmed data. Wherein a program verification operation is indicated, current is provided from the sense amplifier to the memory cell. Where a program verification operation is not indicated, current is cut off from the sense amplifier.

23 Claims, 8 Drawing Sheets

SEMICONDUCTOR MEMORY DEVICE AND RELATED PROGRAMMING METHOD

BACKGROUND OF THE INVENTION

1. Field of the Invention

Embodiments of the invention relate generally to semiconductor memory devices. More particularly, embodiments of the invention relate to NOR flash memory devices and programming methods for such devices.

A claim of priority is made to Korean Patent Application No. 2005-68561 filed on Jul. 27, 2005, the subject matter of which is hereby incorporated by reference in its entirety.

2. Description of Related Art

Semiconductor memory devices generally store and read data, and may be classified as random access memories (RAMs) and read only memories (ROMs). RAMs are volatile memory devices that lose their stored data when power is interrupted. ROMs are non-volatile memory devices that continuously hold stored data even when power is interrupted. RAMs include dynamic RAM (DRAM) and static RAM (SRAM). ROMs include programmable ROM (PROM), erasable PROM (EPROM), electrically EPROM (EEPROM), and flash memory.

Flash memories may be classified into two types, NAND and NOR, in accordance with the logical configuration of their constituent memory cells. NOR flash memory devices are characterized by high speed programming and read operations and are commonly used to store application code. As such, NOR flash memory is commonly used in potable host devices such as mobile phones.

In common conventional form, a flash memory cell is connected between a bitline and a source line and to a wordline. Multiple flash memory cells may be connected to one wordline. Depending on a voltage applied to a given wordline, the connected flash memory cells may be sensed as ON-cell or OFF-cell. The term, "ON-cell" designates a flash memory cell that is turned ON when its corresponding wordline receives a voltage higher than its threshold voltage. In this condition, the flash memory cell allows current to flow. The term "OFF-cell" designates a flash memory cell that is turned OFF when its corresponding wordline receives a voltage lower than its threshold voltage. In this condition, the flash memory cell does not allow current to flow above some incident level.

Conventional NOR flash memory generally requires that a program verification operation be carried out following a program operation. The program verification operation functionally verifies whether or not the threshold voltage of a flash memory cell has reached a desired level. In addition, the program verification operation determines whether or not the program operation has been successful by applying a program verification voltage to the wordline and sensing current flow (or not) from the flash memory cell.

The conventional program verification operation is simultaneously performed across a plurality (or block) of memory cells, (e.g., 128 memory cells). However, within a block of programmed memory cells, some memory cells require program verification and some do not. For example, a memory cell may not require program verification if it is in a state lower than another defined state for programmed memory cells, or if the memory cell is a program-passed memory cell.

If a great many memory cells require program verification, a large amount of current flows in relation to these memory cells. In such cases, the voltage applied to the various connected source lines will increase, and threshold voltages for memory cells within the block of memory cells undergoing program verification may be inadvertently interpreted in an erroneous manner.

For example, if one assumes the use of memory cells having four programmable states, ("11", "10", "01", and "00"), some memory cells may exist in the "11" state and others in the "01" state within the context of a program verification operation. A large amount of current flowing as a result of the presence of memory cells in the "11" state may increase the voltage apparent on source lines associated with the memory cells in the "01" state, for example.

SUMMARY OF THE INVENTION

Embodiments of the invention provide a NOR flash memory device and a related programming method adapted to prevent the inadvertent elevation of a wordline voltage during a program verification operation, and the resulting negative effects.

Thus, in one embodiment, a programming method for a NOR flash memory device comprises; programming data in a memory cell, and during a program verification operation, controlling the supply of current from a sense amplifier to the memory cell in relation to the value of the programming data.

In a related aspect, controlling the supply of current from the sense amplifier to the memory cell is performed only if a program verification operation is indicated for the memory cell. In another aspect, the supply of current from the sense amplifier to the memory cell is cut off if a program verification operation is not indicated for the memory cell.

The method may further comprise disabling the sense amplifier before performing the program verification operation, and then enabling the sense amplifier during the program verification operation, if a program verification operation is indicated for the memory cell.

Alternatively, the method may further comprise enabling the sense amplifier before performing the program verification operation, and then disabling the sense amplifier the program verification operation, if a program verification operation is not indicated for the memory cell.

In another embodiment, the invention provides a programming method for a NOR flash memory device that comprises; programming data in a plurality of memory cells, disabling a plurality of sense amplifiers so as not to supply current to the plurality of memory cells, enabling one of the plurality of sense amplifiers in relation to the value of the programmed data, and performing a program verification operation using the enabled sense amplifier.

In yet another embodiment, the invention provides a programming method of a NOR flash memory device that comprises; programming data in a plurality of memory cells, enabling a plurality of sense amplifiers so as to supply a current to the plurality of memory cells, disabling one of the plurality of sense amplifiers in relation to the value of the programmed data, and performing a program verification operation using sense amplifiers from the plurality of sense amplifiers other than the disabled one.

In yet another embodiment, the invention provides a NOR flash memory device that comprises; a memory cell adapted to store programmed data, a data buffer adapted to store the programmed data, and a sense amplifier adapted to sense a state of the memory cell by supplying current to the memory cell, wherein the sense amplifier is further adapted to control the current supplied to the memory cell in accordance with the value of the programmed data during a program verification operation.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
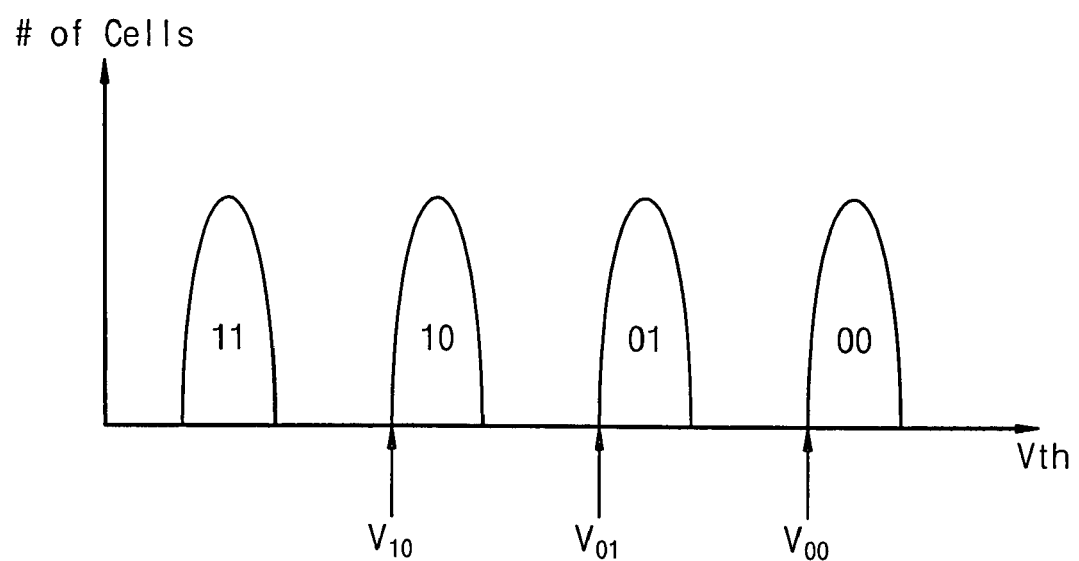
FIG. 1 is a graph of the distribution profiles of threshold voltages.

FIG. 1 is a graph showing a distribution profile for memory cell threshold voltages. An exemplary NOR flash memory device adapted to store multi_bit data is assumed for purposes of this explanation. Various program states for the exemplary NOR flash memory device correspond to the distribution of threshold voltages shown in FIG. 1.

Referring to FIG. 1, a memory cell may be placed into one of four states: "11", "10", "01", and "00" using an appropriate threshold voltage. The "11" state in the illustrated example corresponds to an erased memory cell and has the lowest threshold voltage. The "10" state requires a higher threshold voltage than the "11" state. Similarly, the "01" state requires a higher threshold voltage than the "10" state, and the "00" state requires the highest threshold voltage.

Consistent with conventional practice, a program verification operation functionally verifies whether or not a desired threshold voltage has been programmed with respect to a particular memory cell in view of its intended data state. In one approach, the program verification operation makes this determination by sensing a particular current (hereinafter, referred to as a "cell current") flowing the memory cell. If the cell current is less than a reference current, the memory cell is identified as "program pass". In contrast, if the cell current is greater than the reference current, the memory cell is identified as "program fail". If the memory cell is identified as "program fail", a program operation must be repeated until the correct threshold voltage for the memory cell is achieved.

Referring to FIG. 1, a verification voltage $V_{10}$ is a voltage indicating that the threshold voltage for a programmed memory cell is sufficiently high to properly correspond to the "10" state. Thus, if a memory cell intended to be placed into the "10" state has a threshold voltage less than verification voltage $V_{10}$, the memory cell is identified as "program fail". However, once the memory cell is identified as "program pass", (i.e., properly placed in the "10" state), it is inhibited from being reprogrammed during a subsequent program operation. Similarly, a verification voltage $V_{01}$ is a voltage indicating that the threshold voltage for a programmed memory cell is sufficiently high to properly correspond to the "01" state (e.g., a voltage greater than that associated with the "10" state), and a verification voltage $V_{00}$ is a voltage indicating that the threshold voltage for a programmed memory cell is sufficiently high to properly correspond to the "00" state (e.g., a voltage greater than that associated with the "01" state). These verification voltages may be identified as part of a program operation in relation to a selected wordline.

Figure 2:
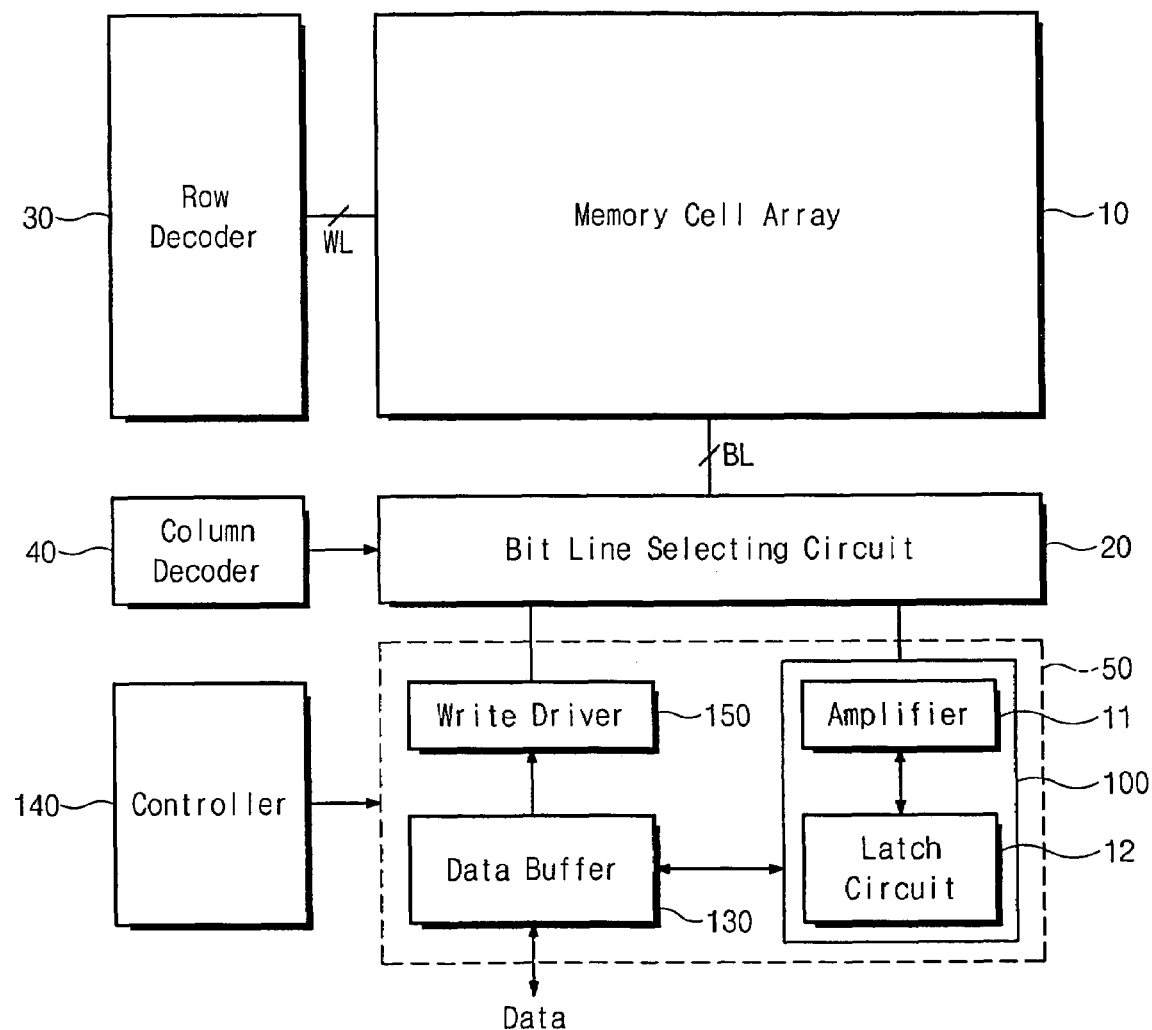
FIG. 2 is a block diagram of a NOR flash memory device according to the present invention.

FIG. 2 is a block diagram of an exemplary NOR flash memory device well adapted to the benefits of the invention. The NOR flash memory device of FIG. 2 generally comprises; a memory cell array 10, a bitline selection circuit 20, a row decoder 30, a column decoder 40, a data input/output circuit 50, and a controller 140. For purposes of this explanation, the operation and interoperation of memory cell array 10, bitline selection circuit 20, row decoder 30, and column decoder 40 are assumed to be conventional and a detailed description thereof will not be presented here.

Referring to FIG. 2, data input/output circuit 50 comprises a sense amplifier 100, a data buffer 130, and a write driver 150. During a program operation, data input to data buffer 130 is programmed to a memory cell selected by write driver 150. During a program verifying operation, the data programmed to the memory cell is output by sense amplifier 100 and data buffer 130. The operation of data input/output circuit 50 is controlled by controller 140.

Referring still to FIG. 2, sense amplifier 100 comprises an amplifier 11 and a latch circuit 12. Amplifier 11 senses and amplifies cell current flowing from the selected memory cell by supplying current to it. During a program verification operation, latch circuit 12 controls current being supplied from amplifier 11 to the memory cell in response to an output signal received from data buffer 130. An exemplary sense amplifier 100 will be described in some additional detail below.

During a program verification operation, the illustrated NOR flash memory device controls current being supplied from sense amplifier 100 to the memory cell according to data stored in the data buffer 130. In other words, if data programmed in the memory cell requires program verification, current is supplied from sense amplifier 100 to the memory cell. If the data programmed in the memory cell does not require program verification, current from sense amplifier 100 is cut off.

Figure 3:
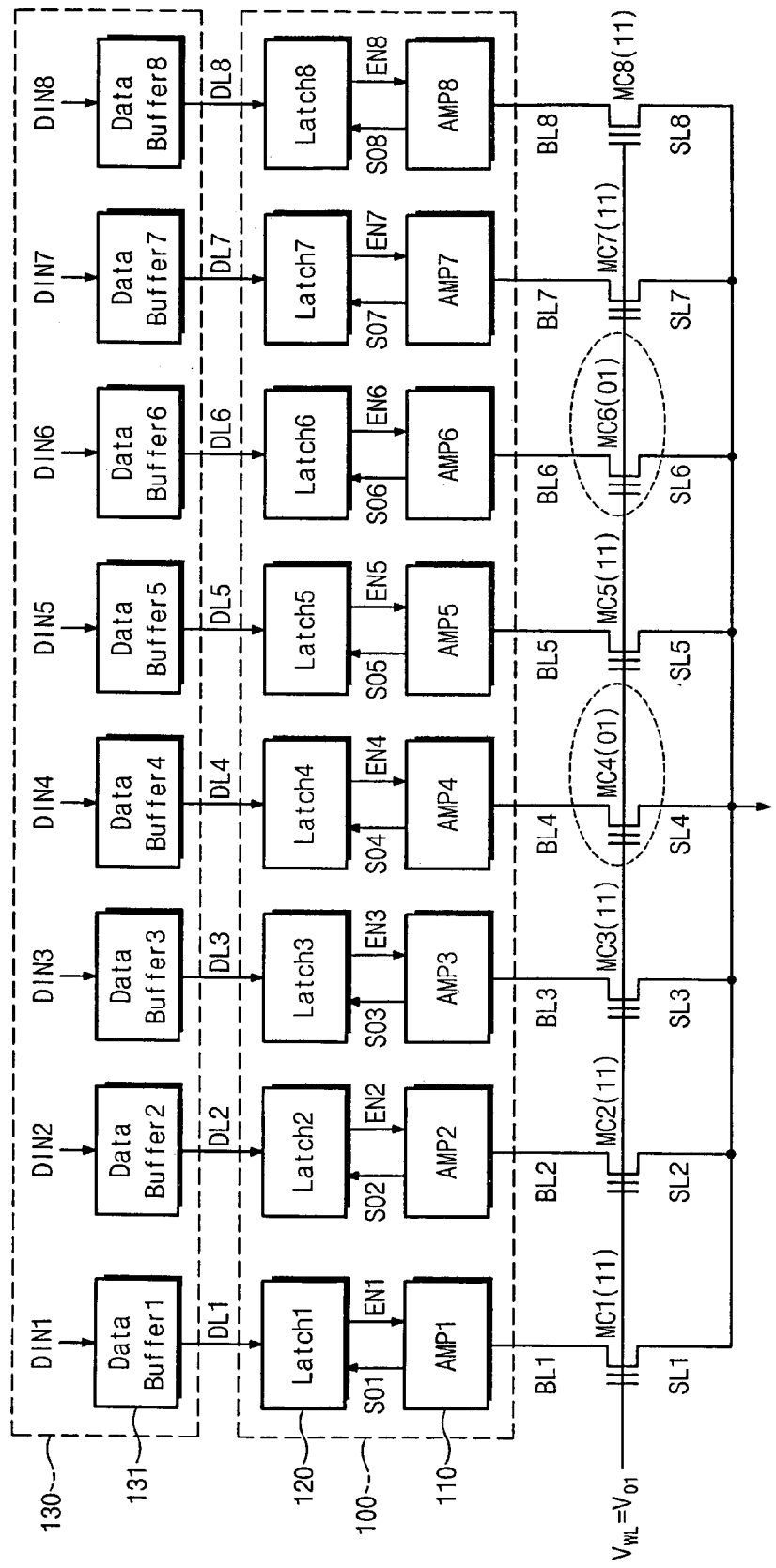
FIG. 3 is a block diagram of a NOR flash memory device performing a program verification operation according to an embodiment of the present invention.

FIG. 3 shows a block diagram of an exemplary NOR flash memory device performing a program verification operation. The illustrated example is drawn to a program verification operation being conducted in relation to the "01" state. Thus, the "01" program verification operation will be carried out after programming "01" data to a selected memory cell (e.g., MC4 and MC6).

Referring to the specific example illustrated in FIG. 3, the fourth and sixth memory cells (MC4 and MC6) are memory cells programmed with "01" data (i.e., placed in the "01" state), while the remaining memory cells (MC1 through MC3, MC5, MC7, and MC8) are assumed to maintain an erase state, (i.e., remain in the "11" state). During the "01" program verification operation, corresponding fourth and sixth amplifier circuits (AMP4 and AMP6) are enabled, but the remaining of amplifiers (AMP1 through AMP3, AMP5, AMP7 and AMP8) are disabled.

Referring again to FIG. 3, the NOR flash memory device comprises sense amplifier 100 connected between the memory cells and data buffer 130. Sense amplifier 100 comprises amplifier circuits AMP1 through AMP8, and corresponding latch circuits Latch 1 through Latch 8. Each combination of sense amplifier and latch circuit is assumed to have the same construction and operation for purposes of this explanation. Thus, a first amplifier circuit 110 (e.g. AMP 1) and a first latch circuit 120 (e.g., Latch 1) will be described as indicative of the group.

Memory cell MC1 is connected between a bitline BL1 and a source line SL1, and is controlled by a wordline voltage ($V_{WL}$). Memory cell MC1 is in an erase state, that is, the "11" state. During the "01" program operation, verification voltage $V_{01}$ is supplied to the wordline. As shown in FIG. 1, verification voltage $V_{01}$ is greater than the threshold voltage of memory cell MC1 in the "11" state. Accordingly, memory cell MC1 is turned ON during the "01" verification operation. When the memory cell MC1 is turned ON, the voltage level apparent on source line SL1 increases. As such, during the "01" verification operation, the voltage apparent on the respective source lines (SL4 and SL6) connected to the fourth and sixth memory cells (MC4 and MC6) will also be increased. If these increased source line voltages are not corrected, the program verification results for the fourth and sixth memory cells (MC4 and MC6) may be different from the intended program state(s). Namely, the fourth and sixth memory cells (MC4 and MC6) may be identified as "program pass" before actually reaching a threshold voltage consistent with the "01" state.

Referring still to FIG. 3, sense amplifier 110 supplies current to memory cell MC1 via bitline BL1 and senses the state of memory cell MC1. Sense amplifier 110 then senses the state of memory cell MC1 and supplies an output signal (SO1) to latch circuit 120.

Latch circuit 120 receives the output signal (SOl) from sense amplifier 110 and an output signal (DL1) from data buffer 130 during the program verification operation, and provides an enable signal (EN1) to sense amplifier 110. Latch circuit 120 provides the enable signal (EN1) to sense amplifier 110 to control the current being supplied to memory cell MC1 during the program verification operation.

Data buffer 130 receives the data (DIN1 through DIN8) to be programmed to memory cells MC1 through MC8 during a program operation. Data buffer 131 provides the output signal (DL1) to latch circuit 120 when data stored in memory cell MC1 during a program operation requires program verification. Latch circuit 120 provides the enable signal (EN1) to amplifier circuit 110 in response to the output signal (DL1) supplied from data buffer 131.

However, during a program verification operation the NOR flash memory device of FIG. 3, selectively enables only the fourth and sixth amplifier circuits (AMP4 and AMP6) connected respectively to the fourth and sixth memory cells (MC4 and MC6), thereby avoiding the program verification error associated with conventional NOR flash memory devices.

Figure 4:
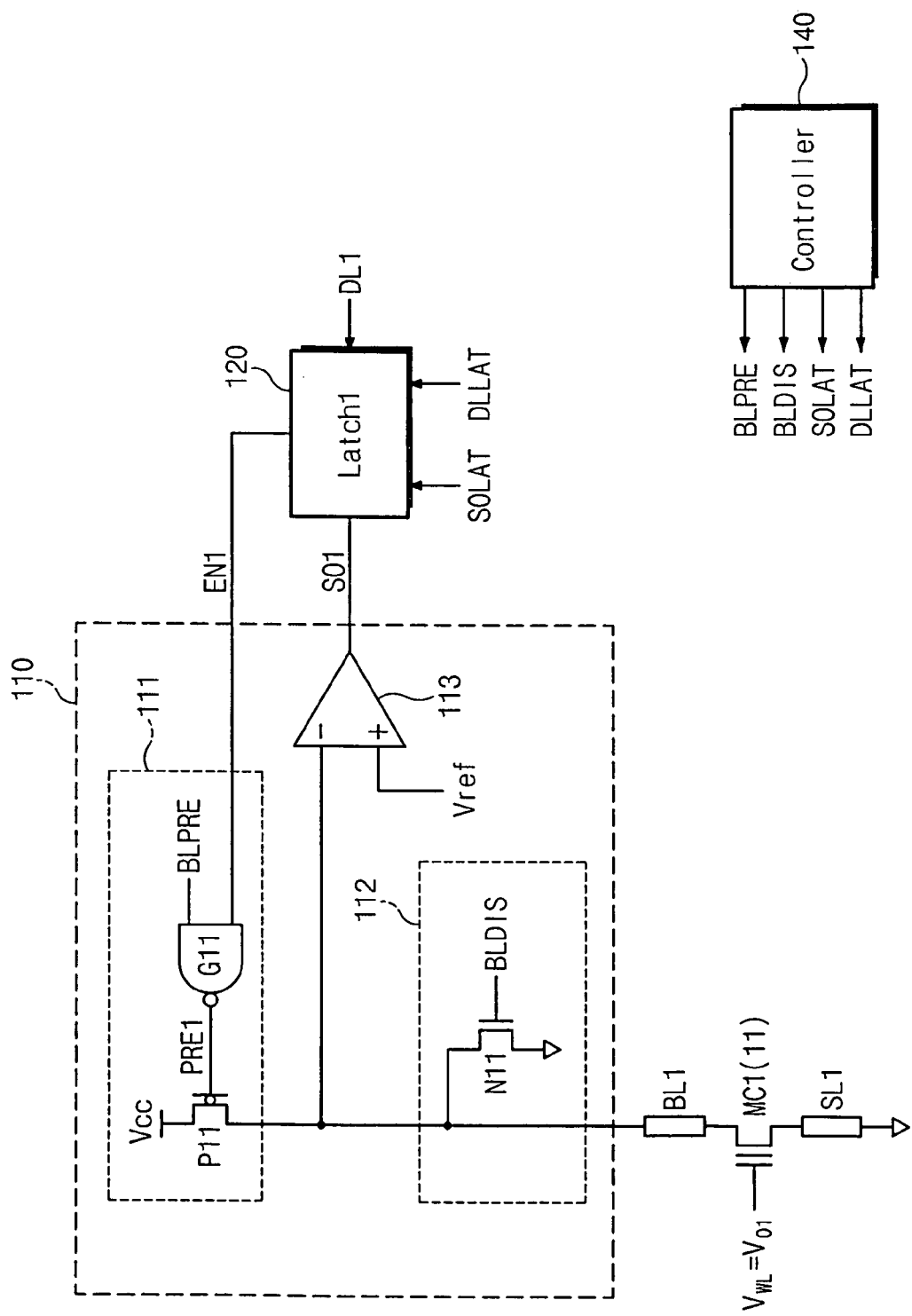
FIG. 4 is a circuit diagram showing an amplifier of FIG. 3.
Figure 5:
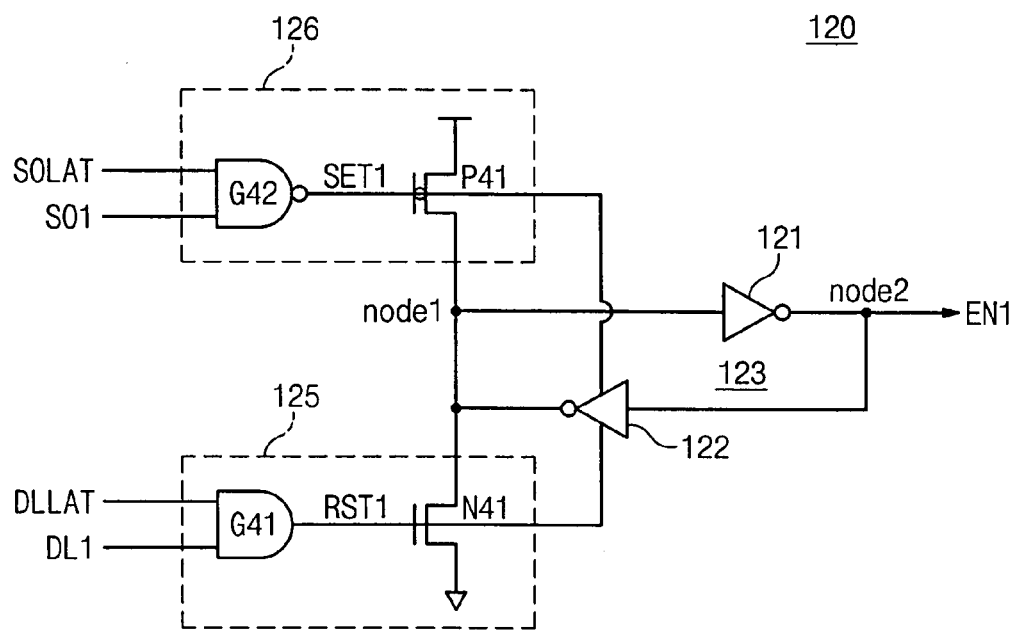
FIG. 5 is a circuit diagram showing a latch circuit of FIG. 3.
Figure 6:
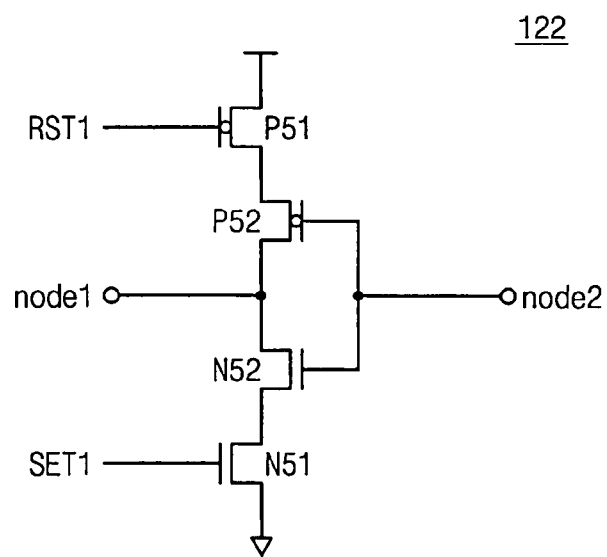
FIG. 6 is an exemplary circuit diagram showing an inverter of the latch circuit of FIG. 5.

FIG. 4 is a circuit diagram showing an exemplary amplifier circuit adapted for use as amplifier circuit 110 of FIG. 3. FIGS. 5 and 6 are circuit diagrams showing respective, exemplary latch circuits adapted for use as any one of Latch1 through Latch8 of FIG. 3. The operation of these exemplary circuits will be described with reference to FIG. 7.

Figure 7:
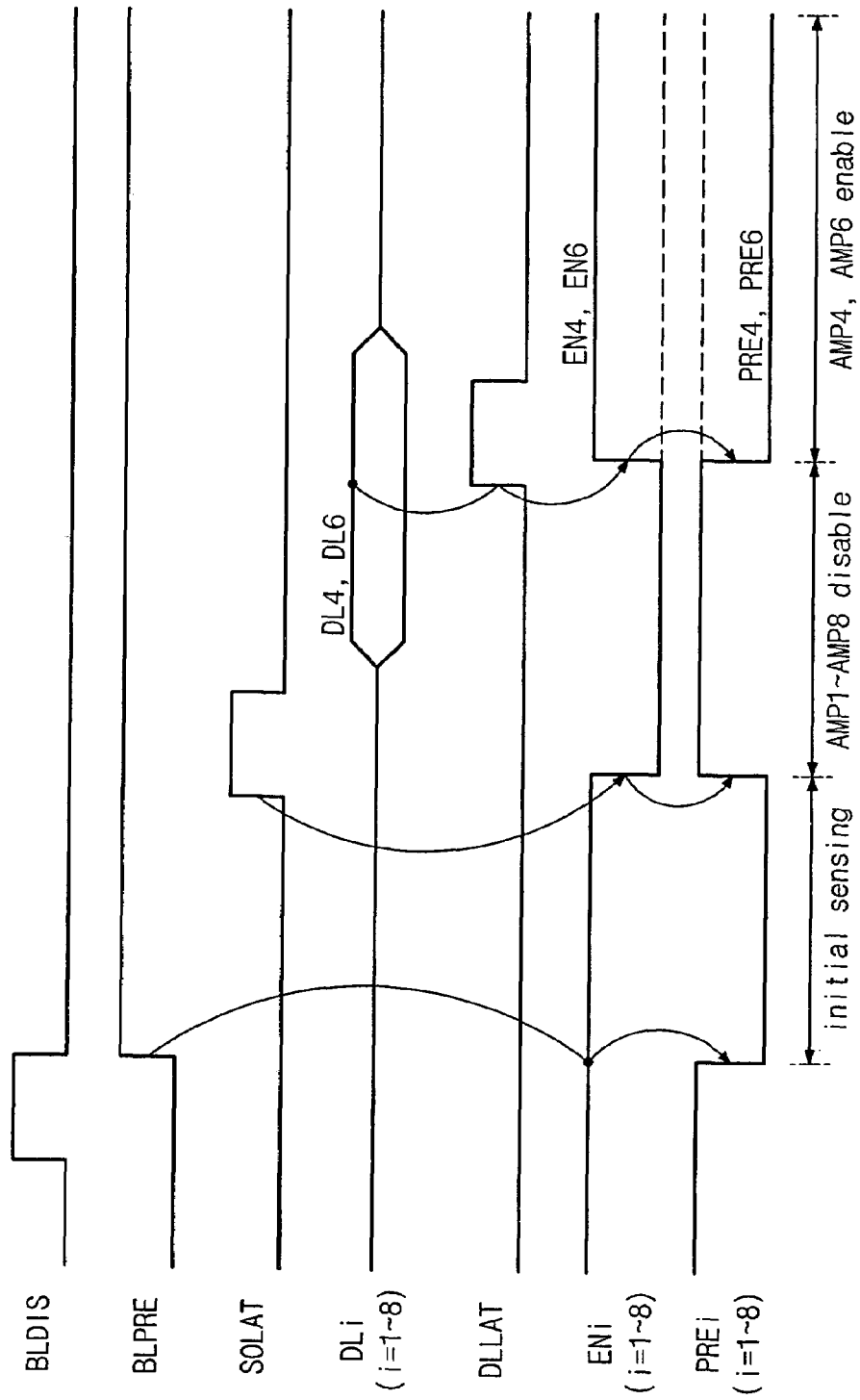
FIG. 7 is a timing diagram illustrating an operation of the NOR flash memory device of FIG. 3.

Reference is made to FIG. 7 with the assumption of a NOR flash memory device comprising amplifier circuit 110 connected between memory cell MC1 and latch circuit 120, and adapted to receive a bitline precharge signal (BLPRE) and a bitline discharge signal (BLDIS) from controller 140. Amplifier circuit 110 is further assumed to comprise a precharge circuit 111, a discharge circuit 112, and an amplifier 113.

With reference to FIG. 4, precharge circuit 111 is connected so as to provide a power voltage (Vcc) to the bit line BL1 in response to the enable signal (EN1) from latch circuit 120 and bitline precharge signal (BLPRE) from controller 140. In the illustrated example, precharge circuit 111 comprises a PMOS transistor P11 and a NAND gate G11. NAND gate Gl1 receives the bitline precharge signal (BLPRE) and the enable signal (EN1), and provides a precharge signal (PRE1) to the gate of PMOS transistor P11.

Discharge circuit 112 is connected between the bitline BL1 and ground. Discharge circuit 112 discharges charges from the first bit line BL1 to ground in response to the bitline discharge signal (BLDIS) from controller 140. In the illustrated example, discharge circuit 112 comprises an NMOS transistor N11.

Amplifier 113 compares cell current received from memory cell MC1 with a reference current (Vref) in order to sense the state of memory cell MC1. The reference voltage (Vref) may be supplied from a reference voltage generator (not shown). In one embodiment, amplifier 113 generates a reference current in response to the received reference voltage.

The exemplary latch circuit 120 shown in FIG. 5 comprises a latch 123, a reset circuit 125, and a set circuit 126. Latch 123 may be formed from two inverters 121 and 122 connected between a first node (node1) and a second node (node 2). The enable signal (EN1) is generated from the second node (node2) and provided to precharge circuit 111. (See, e.g., FIG. 4). Inverter 122 is controlled by a reset signal (RST1) received from reset circuit 125 and a set signal (SET1) received from set circuit 126. The construction and operation of an exemplary inverter 122 will be described hereafter with reference to FIG. 6.

Reset circuit 125 is connected between the first node (node1) and the ground. Reset circuit 125 resets the first node (node1) in response to a latch signal (DLLAT) received from controller 140, see FIG. 4, and the output signal (DL1) received from data buffer 131, see FIG. 3. In one embodiment, reset circuit 125 comprises an NMOS transistor N41 and an AND gate G41. The AND gate G41 receives the latch signal (DLLAT) and the output signal (DL1) and generates the reset signal (RST1). The reset signal (RST1) is provided to the gate of NMOS transistor N41.

Set circuit 126 is connected between a power terminal and the first node (node1). Set circuit 126 provides power voltage (Vcc) to the first node (node1) in response to a latch signal (SOLAT) received from controller 140 and an output signal from amplifier 110. In one embodiment, set circuit 126 comprises a NAND gate G42 and PMOS transistor P41. The NAND gate G42 receives the latch signal (SOLAT) and the output signal (SO1) to generate a set signal (SET1). The set signal (SET1) is provided to the gate of PMOS transistor P41.

FIG. 6 is a circuit diagram showing an exemplary inverter 122 adapted for use in the latch shown in FIG. 5. In the illustrated example, inverter 122 comprises two NMOS transistors, N51 and N52, and two PMOS transistors, P51 and P52. The NMOS transistor N51 is controlled by the set signal (SET1), and the PMOS transistor P51 is controlled by the reset signal (RST1).

When the set signal (SET1) is logically low in the illustrated example, the NMOS transistor N51 is turned OFF. By so doing, the discharge of a voltage apparent at the first node (node1) may be prevented when the PMOS transistor P41 is turned ON. When the reset signal (RST1) is logically high, the PMOS transistor P51 is tuned OFF. By so doing, the voltage apparent at first node (node1) may be kept below a desired threshold when the NMOS transistor N41 is turned ON.

FIG. 7 is a timing diagram illustrating the operation of the NOR flash memory device shown in FIG. 3. The operation of the NOR flash memory device will be described referring to FIGS. 3 through 7.

In the event that the bitline discharge signal (BLDIS) is provided to the amplifier circuits AMP1 through AMP8, the bit lines BL1 though BL8 are discharged to a ground. With discharged bit lines BL1 through BL5, an initial sensing operation is performed. After the initial sensing operation is performed, output signals SO1 through SO8 from the amplifier circuits AMP1 though AMP8 are set to logical high. The reason for doing this is that if the sensing operation is performed under the condition that the bit line is discharged, the memory cell is sensed as "ON-cell".

If the latch signal (SOLAT) is activated under the condition that the output signals SO1 through SO8 of the amplifier circuits AMP1 through AMP8 are high, the set signal (SET1) is low. See, FIG. 5. The reason for this is that both inputs (SOLAT and SO) of the NAND gate G42 are high. If the set signal (SET1) is low, the first node (node1) and second node (node2) are both low. In this case, since enable signals EN1 through EN8 are low, all amplifier circuits AMP1 though AMP8 become disabled. The reason for this is that if the enable signals EN1 though EN8 are low, the precharge signals PRE1 though PRE8 are high.

Next, output signals DL1 though DL8 are generated in accordance with the intended data values to be stored. If data programmed to the memory cell needs a program verification, a high output signal is generated. In the illustrated example, output signals DL4 and DL6 become high, and the remaining output signals DL1 though DL3, DL7, and DL8 are low.

Subsequently, the latch signal (DLLAT) is applied to the latch circuits Latch 1 though Latch 8. At this time, the enable signals EN4 and EN6 are activated. If the enable signals EN4 and EN6 are activated, the precharge signals PRE4 and PRE6 become low, and the rest of precharge signals PRE1 though PRE8, PRE5, PRE7, and PRE8 are high. Accordingly, a program verification operation is performed with respect to only the fourth and sixth memory cells MC4 and MC6.

Figure 8:
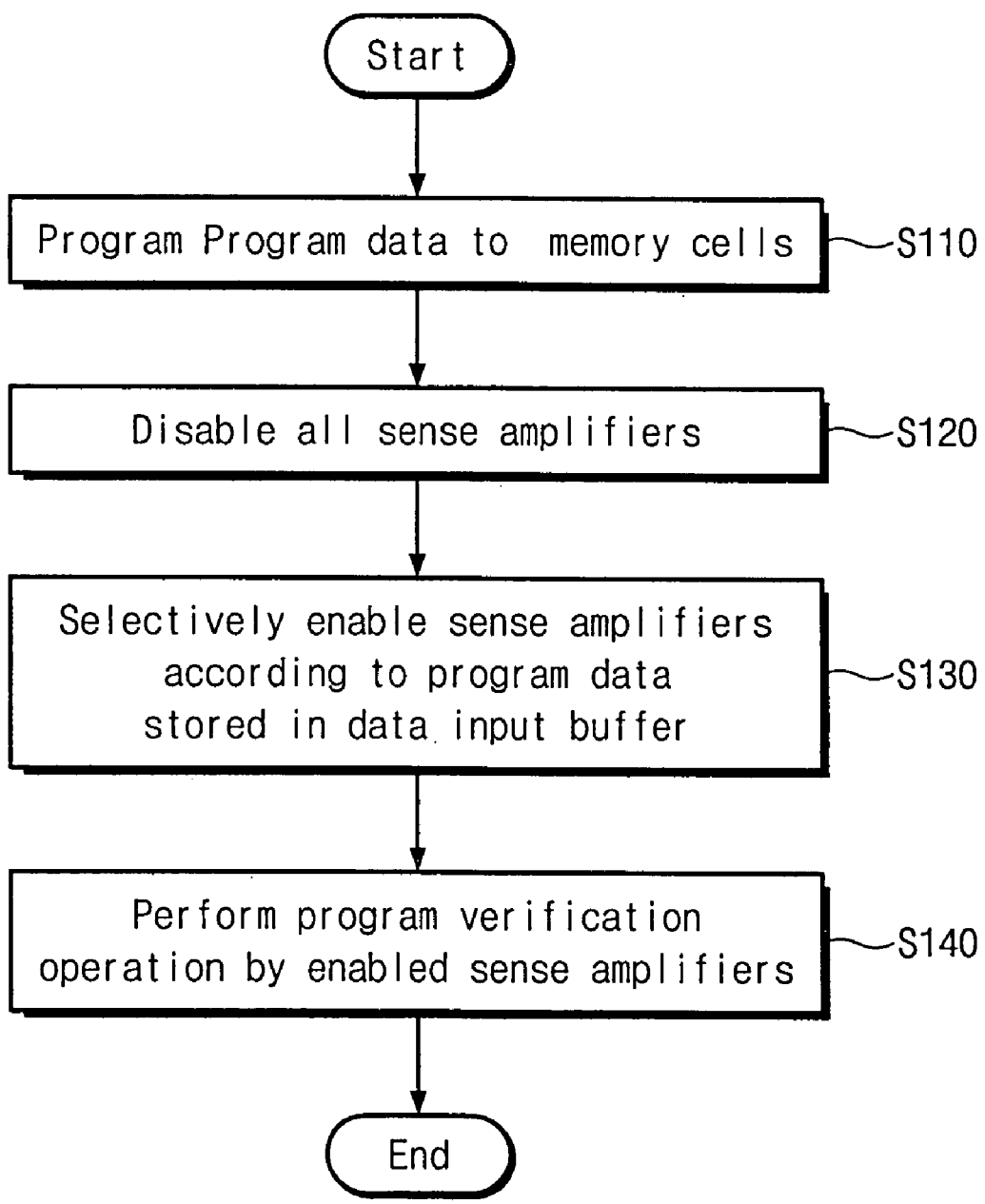
FIG. 8 is a flowchart illustrating a programming method of a NOR flash memory device according to a first embodiment of the present invention.

FIG. 8 is a flowchart illustrating an exemplary programming method for a NOR flash memory device according to one embodiment of the invention. According to this method, a program operation is performed (S110), and then a program verification operation is performed.

Before performing the program verification operation, all sense amplifiers are disabled (S120). The NOR flash memory device performs an initial sensing operation while the bit line is discharged so as to disable all sense amplifiers.

Subsequently, the sense amplifiers are selectively enabled depending on program data stored in the data buffer (S130). In case that the stored program data needs a program verification, a high output signal DLi is generated. The latch circuit provides an enable signal ENi to the amplifier circuit in response to the high output signal received from the data buffer. The amplifier circuit performs a program verification operation in response to the enable signal (S140).

Figure 9:
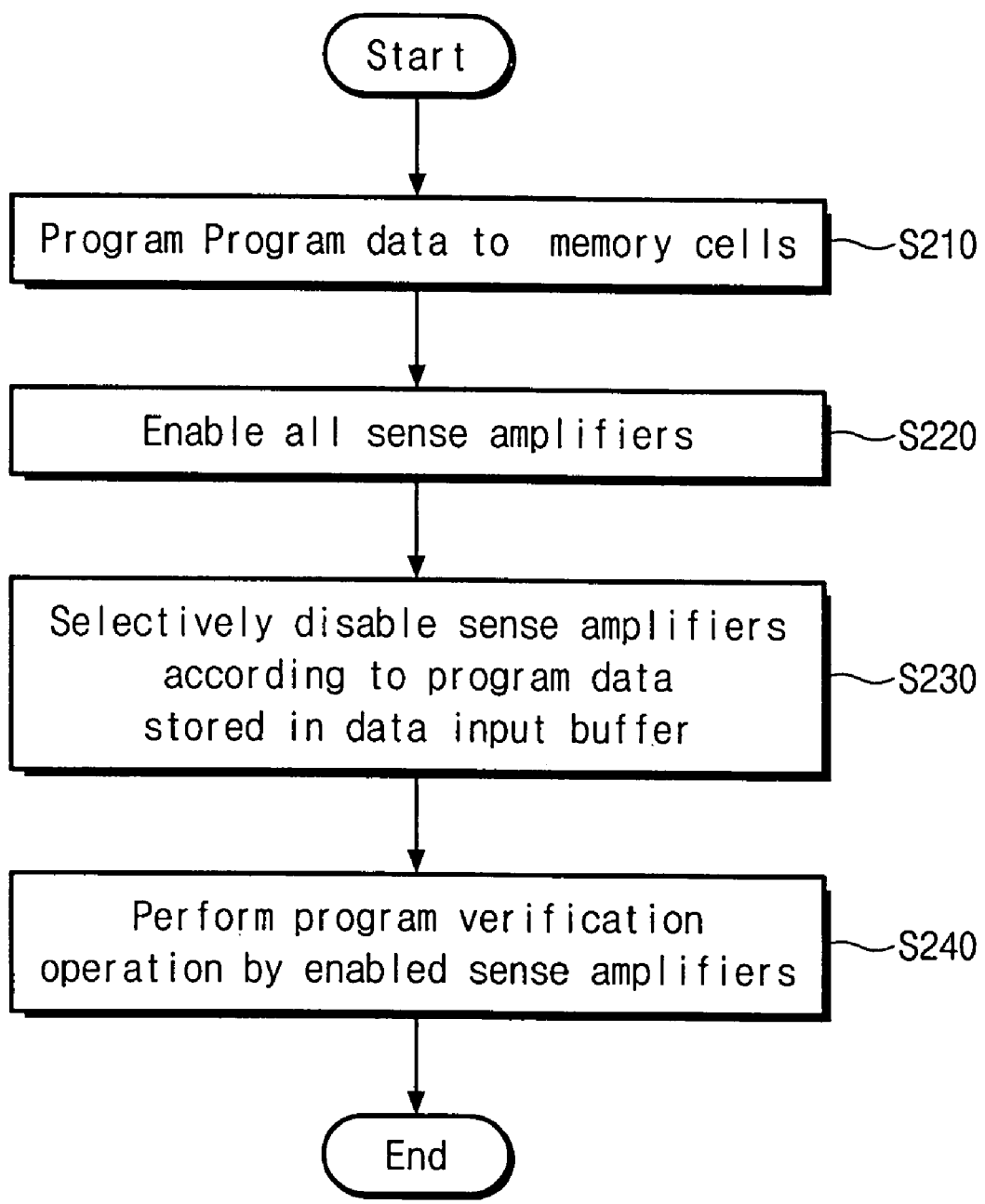
FIG. 9 is a flowchart illustrating a programming method of a NOR flash memory device according to a second embodiment of the present invention.

FIG. 9 is a flowchart illustrating an exemplary programming method for a NOR flash memory device according to another embodiment of the invention. In accordance with the programming method, a program operation is performed (S210), and then a program verification operation is performed.

Before performing a program verification operation, all sense amplifiers are enabled (S220). In order to enable all sense amplifiers, the NOR flash memory device performs an initial sensing operation while a bit line is precharged.

Next, the sense amplifiers are selectively disabled depending on program data stored in the data buffer (S230). If the program data stored in the data buffer does not need a program verification, the data buffer generates a high output signal DLi. The latch circuit provides a disable signal DISi to the amplifier circuit in response to the high output signal received from the data buffer. If the disable signal is applied to the amplifier circuit, the sense amplifier does not perform a program verification operation.

Next, the NOR flash memory device performs a program verification operation by the sense amplifier being in an enable state (S240).

According to the NOR flash memory device and a programming method thereof, a program verification operation is accomplished by sense amplifiers that are selectively enabled. In addition, the sense amplifiers requiring a program verification are selectively enabled. Accordingly, it is possible to avoid a program verification error caused by an elevated voltage on a source line during a program verification operation, and correct program verification results may be obtained.

The foregoing embodiments are merely teaching examples. Those of ordinary skill in the art will understand that various changes in form and detail may be made to the exemplary embodiments without departing from the scope of the present invention as defined by the following claims.

What is claimed:

1. A programming method for a NOR flash memory device, the programming method comprising:
storing a data value in a data buffer and providing the data value to a latch associated with a sense amplifier connected to the data buffer;
programming the data value in a memory cell connected to a sense amplifier;
sensing a data state for the memory cell in the sense amplifier; and
during a program verification operation, enabling the supply of current from the sense amplifier to the memory cell in relation to the data value provided to the latch and the data state sensed for the memory cell.

2. The programming method of claim 1, wherein enabling the supply of current from the sense amplifier to the memory cell is performed only if a program verification operation is indicated for the memory cell.

3. The programming method of claim 1, further comprising:
disabling the sense amplifier before performing the program verification operation.

4. The programming method of claim 3, further comprising:
after disabling the sense amplifier, enabling the sense amplifier during the program verification operation, only if a program verification operation is indicated for the memory cell.

5. The programming method of claim 3, further comprising: enabling the sense amplifier before performing the program verification operation.

6. The programming method of claim 5, further comprising:
after enabling the sense amplifier, disabling the sense amplifier the program verification operation, if a program verification operation is not indicated for the memory cell.

7. A programming method for a NOR flash memory device, the programming method comprising:
   programming data in a plurality of memory cells;
   disabling a plurality of sense amplifiers by discharging a plurality of bit lines connected to the plurality of memory cells and afterwards performing an initial sensing operation, and cutting off current supplied from the plurality of sense amplifiers to the plurality of memory cells in accordance with the results of the initial sensing operation;
   enabling at least one of the plurality of sense amplifiers in relation to the value of the programmed data; and
   performing a program verification operation using the enabled at least one of the plurality of sense amplifiers.

8. The programming method of claim 7, wherein the programmed data is multi-bit data.

9. A programming method of a NOR flash memory device, the programming method comprising:
   storing data in a plurality of data buffers respectively associated with a plurality of memory cells and providing the data to a plurality of latches respectively associated with a plurality of sense amplifiers connected to the plurality of memory cells;
   programming the data in the plurality of memory cells;
   sensing a data state for each one of the plurality of memory cells in a corresponding one of the plurality of sense amplifiers;
   enabling plurality of sense amplifiers to supply current to the plurality of memory cells;
   selectively disabling at least one of the plurality of sense amplifiers in relation to at least one of the data state sensed for a corresponding one of the plurality of memory cells or the data stored in a corresponding one of the plurality of data buffers; and
   performing a program verification operation using only sense amplifiers in the plurality of sense amplifiers not disabled.

10. The programming method of claim 9, wherein the programmed data is multi-bit data.

11. The programming method of claim 9, wherein the disabled at least one of the plurality of sense amplifiers corresponds to a memory cell having a threshold voltage less than a threshold voltage not requiring a program verification operation.

12. The programming method of claim 9, wherein the disabled at least one of the plurality of sense amplifiers corresponds to a memory cell having an erased state.

13. A NOR flash memory device comprising:
   a memory cell adapted to store data;
   a data buffer adapted to store the data; and
   a sense amplifier adapted to sense a data state of the memory cell by supplying current to the memory cell, wherein the sense amplifier comprises:
      an amplifier circuit supplying current to the memory cell and providing an output signal indicative of the sensed data state of the memory cell; and
      a latch circuit responsive to data received from the data buffer and the output signal from the amplifier circuit to provide an enable signal controlling the supply of current by the amplifier circuit to the memory cell during a program verification operation.

14. The NOR flash memory device of claim 13, wherein the latch circuit provides the enable signal to the amplifier circuit only if a program verification operation is indicated for the memory cell.

15. The NOR flash memory device of claim 14, wherein the latch circuit cuts off current to the memory cell if a program verification operation is not indicated for the memory cell.

16. The NOR flash memory device of claim 13, wherein the latch circuit comprises:
   a latch connected between first and second nodes;
   a reset circuit connected between the first node and ground, and adapted to reset the first node to ground in response to the output signal of the data buffer; and
   a set circuit connected between a power voltage and the first node, and adapted to set the first node to the power voltage in response to the output signal of the amplifier circuit.

17. The NOR flash memory device of claim 13, wherein the programmed data is multi-bit data.

18. A method of programming multi-bit data in a NOR flash memory device, comprising:
   storing data having one of N data states in a data buffer;
   providing data having one of N data states to a latch associated with a sense amplifier connected to the data buffer;
   programming data having one of N data states in a memory cell connected to a sense amplifier; and
   following the programming of data to the memory cell, performing a program verification operation in relation to one of the N data states,
   wherein prior to the program verification operation an actual data state for the memory cell is sensed by the sense amplifier, such that
   the supply of current from the sense amplifier to the memory cell is selective enabled in relation to at least one of the data provided to the latch and the actual data state sensed for the memory cell.

19. The method of claim 18, wherein the selective enablement of the supply of current from the sense amplifier to the memory cell comprises:
   first disabling the sense amplifier and thereafter selectively enabling the sense amplifier in relation to the data provided to the latch.

20. The method of claim 19, wherein the program verification operation is performed following the selective enablement of the sense amplifier.

21. The method of claim 18, wherein the selective enablement of the supply of current from the sense amplifier to the memory cell comprises:
   first enabling the sense amplifier and thereafter selectively disabling the sense amplifier in relation to the data provided to the latch.

22. The method of claim 21, wherein the program verification operation is performed following the selective disablement of the sense amplifier.

23. A method of programming a NOR flash memory device, the method comprising:
   programming data in a plurality of memory cells; and
   during a program verification operation, selectively enabling a supply of current to the plurality of memory cells in relation to the data to avoid a program verification error otherwise caused by an elevated voltage on a source line commonly connected to the plurality of memory cells.

* * * * *